(12) United States Patent
Nishimura et al.

(10) Patent No.: US 6,501,513 B1
(45) Date of Patent: Dec. 31, 2002

(54) TELEVISION SIGNAL RECEIVING TUNER

(75) Inventors: Takashi Nishimura, Fukushima-ken (JP); Masaki Yamamoto, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/440,906

(22) Filed: Nov. 16, 1999

(30) Foreign Application Priority Data

Nov. 27, 1998 (JP) ............................................. 10-336668

(51) Int. Cl.⁷ .............................. H04N 5/44; H04N 5/50
(52) U.S. Cl. ...................... 348/731; 348/725; 348/732; 348/733
(58) Field of Search ................................ 348/731, 732, 348/733, 735, 725, 726, 729, 723; 375/340, 344, 345, 316, 324; 455/3.2; H04N 5/44, 5/50

(56) References Cited

U.S. PATENT DOCUMENTS

| | | | |
|---|---|---|---|
| 5,659,372 A | * 8/1997 | Patel et al. | 348/731 |
| 5,892,799 A | * 4/1999 | Jaakkola | 375/340 |
| 5,898,900 A | * 4/1999 | Richter et al. | 455/3.2 |
| 6,046,781 A | * 4/2000 | LeRoy | 348/731 |
| 6,094,236 A | * 7/2000 | Abe et al. | 348/731 |
| 6,243,567 B1 | * 6/2001 | Saito | 455/188.2 |
| 6,252,634 B1 | * 6/2001 | Yuen et al. | 348/731 |
| 6,307,599 B1 | * 10/2001 | Komatsu | 348/731 |

FOREIGN PATENT DOCUMENTS

| | | |
|---|---|---|
| EP | 0 392 772 A2 | 10/1990 |
| EP | 0 851 580 A1 | 7/1998 |
| EP | 0 899 877 A1 | 3/1999 |
| EP | 0 911 962 A1 | 4/1999 |
| GB | 2 188 501 A | 9/1987 |
| JP | 5-64101 | 3/1993 |
| JP | 9-163265 | 6/1997 |
| WO | WO 98/38799 | 9/1998 |

* cited by examiner

Primary Examiner—John Miller
Assistant Examiner—Jean W. Désir
(74) Attorney, Agent, or Firm—Brinks Hofer Gilson & Lione

(57) ABSTRACT

A television signal receiving tuner comprises: an integrated circuit including a mixer and an intermediate frequency circuit which frequency convert at least a received television signal RF to an intermediate frequency signal IF; a first intermediate frequency amplifying circuit which is separate from the integrated circuit and has an amplification degree; and an SAW filter which is separate from the integrated circuit and attenuates adjacent bands out of the intermediate frequency band BW of the television signal by a predetermined attenuation amount. The integrated circuit has at least a first terminal and a second terminal and outputs the intermediate frequency signal IF obtained by the frequency conversion by the mixer from the first terminal, and the intermediate frequency signal is serially passed through the intermediate frequency amplifying circuit and the SAW filter and supplied from the second terminal to the intermediate frequency circuit.

2 Claims, 2 Drawing Sheets

TELEVISION SIGNAL RECEIVING TUNER

BACKGROUND OF THE INVENTION

1. Field of the Invention

The present invention relates to a television signal receiving tuner.

2. Description of the Related Art

A conventional television signal receiving tuner will be described with reference to a block diagram of FIG. 3 and a selectivity characteristic diagram of FIG. 4.

In FIG. 3, a television signal receiving tuner comprises a mixer 21, a local oscillator 21, an SAW filter 23, an intermediate frequency circuit 24, and the like. In recent years, the television signal receiving tuner is also formed on an integrated circuit for miniaturization, and the mixer 21, local oscillator 22, intermediate frequency circuit 24, and the like are integrally formed on an integrated circuit 25.

The integrated circuit 25 has a plurality of terminals 26 to 33 so as to be connected to other circuits.

A television signal RF received by an antenna (not shown) passes through a resonance circuit (not shown) and is supplied to the mixer 21 in the integrated circuit 25 via the input terminal 30. The television signal RF is frequency converted by the mixer 21 and the local oscillator 22 and is outputted as an intermediate frequency signal IF from the first terminal 27 to the outside of the integrated circuit. The intermediate frequency signal IF outputted from the first terminal 27 passes through the SAW filter 23 and is supplied again to the integrated circuit 25 via the second terminal 28. The intermediate frequency signal IF which is supplied again to the integrated circuit 25 is properly amplified by an intermediate frequency amplifying circuit 34 in the intermediate frequency circuit 24 to a level necessary for a detecting operation of a video detecting circuit (not shown) at the post stage, and the resultant signal is outputted from the integrated circuit 25 via the output terminal 29.

The selectivity characteristic of the SAW filter 23 has, as shown by A in FIG. 4, a sharp attenuation characteristic out of an intermediate frequency band BW in order to eliminate interference from adjacent channels. An attenuation amount of each of a video intermediate frequency signal +P which is in an adjacent band on the upper side and a sound intermediate frequency signal −S which is in an adjacent band on the lower side from a video intermediate frequency signal P is 45 dB.

The insertion loss of the SAW filter 23 is 15 dB.

On the other hand, since the distance between adjacent terminals in the integrated circuit 25 is short, the t terminals are not isolated from each other sufficiently.

For example, the isolation between the first terminal 27 for outputting the intermediate frequency signal IF from the integrated circuit 25 to the outside and the second terminal 28 for again supplying the signal into the integrated circuit 25 is 40 dB.

In the configuration, when it is assumed that the level of the video intermediate frequency signal P in the first terminal 27 is a reference value 0 dB, since the insertion loss of the SAW filter 23 is 15 dB, as shown in FIG. 4, the level of the video intermediate frequency signal P in the second input terminal 28 is −15 dB.

On the other hand, since the isolation between the first terminal 27 and the second terminal 28 in the integrated circuit 25 is 40 dB, the video intermediate frequency signal +P which is in the adjacent band on the upper side and the sound intermediate frequency signal −S which is in the adjacent band on the lower side in the first terminal 27 appear in the second terminal 28 at the level attenuated by 40 dB from the reference value 0 dB (refer to the straight line B in FIG. 4).

Even when a signal of a adjacent channel is attenuated by 45 dB by the SAW filter 23, the difference between the level of the video intermediate frequency signal P at the second terminal 28 and the level of each of the video intermediate frequency signal +P in the adjacent band on the upper side the sound intermediate frequency signal −S in the adjacent band on the lower side is decreased to 25 dB.

Consequently, interference of the signals of the adjacent channels easily occurs and the video quality deteriorates.

SUMMARY OF THE INVENTION

It is therefore an object of the invention to realize a television signal receiving tuner capable of improving the video quality of a television receiver by substantially enlarging the difference between the level of a video intermediate frequency signal P in an intermediate frequency band and the level of each of a video intermediate frequency signal +P which is in the adjacent band on the upper side and a sound intermediate frequency signal −S which is the adjacent band on the lower side.

According to the invention, in order to achieve the object, there is provided a television signal receiving tuner comprising: an integrating circuit including a mixer and an intermediate frequency circuit which frequency convert at least a received television signal to an intermediate frequency signal; an intermediate frequency amplifying circuit which is separate from the integrated circuit and has an amplification degree; and an SAW filter which is separate from the integrated circuit and attenuates adjacent bands out of the intermediate frequency band of the television signal by a predetermined attenuation amount, wherein the integrated circuit has at least a first terminal and a second terminal and outputs the intermediate frequency signal obtained by the frequency conversion by the mixer from the first terminal, and the intermediate frequency signal is serially passed through the intermediate frequency amplifying circuit and the SAW filter and supplied from the second terminal to the intermediate frequency circuit.

According to the television signal receiving tuner of the invention, the amplification degree of the intermediate frequency amplifying circuit is set to be equal to or higher than a value which is obtained by adding insertion loss of the SAW filter to the absolute value of a difference between the isolation between the first terminal and the second terminal and the attenuation amount of the SAW filter.

According to the television signal receiving tuner of the invention, the intermediate frequency amplifying circuit is provided at the front stage of the SAW filter.

DETAILED DESCRIPTION OF THE PREFERRED EMBODIMENT

Figure 1:
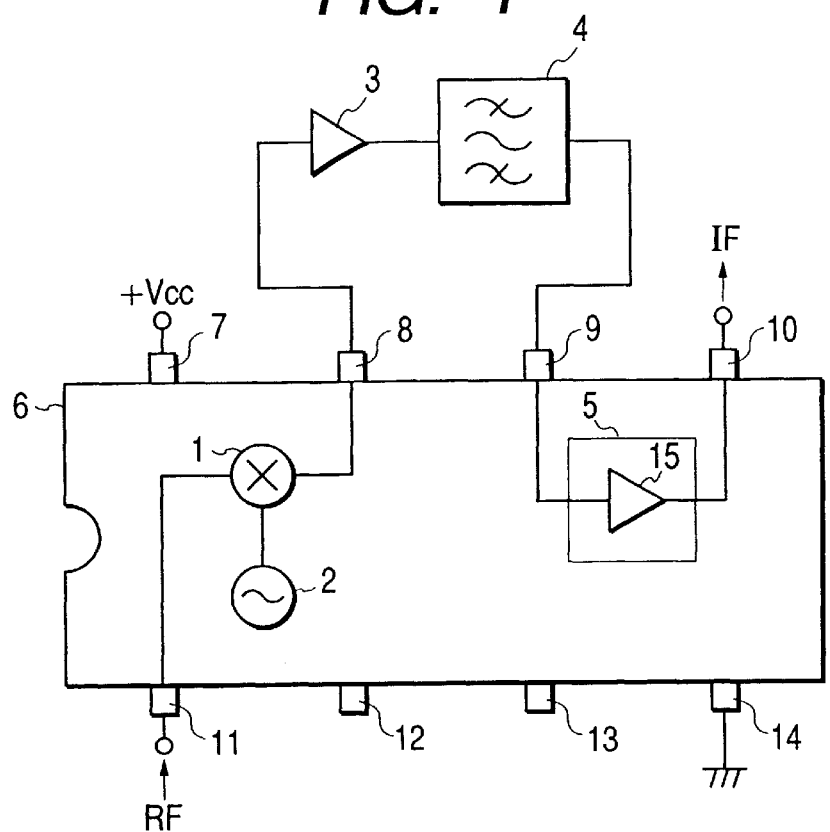
FIG. 1 is a block diagram showing the configuration of an intermediate frequency circuit of the invention.
Figure 2:
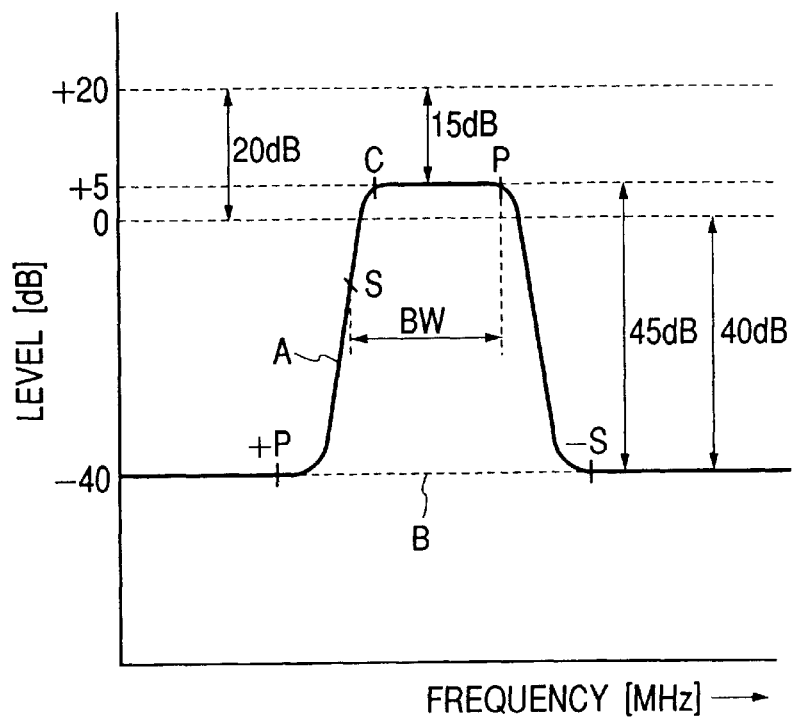
FIG. 2 is a selectivity characteristic diagram of the intermediate frequency circuit of the invention.
Figure 3:
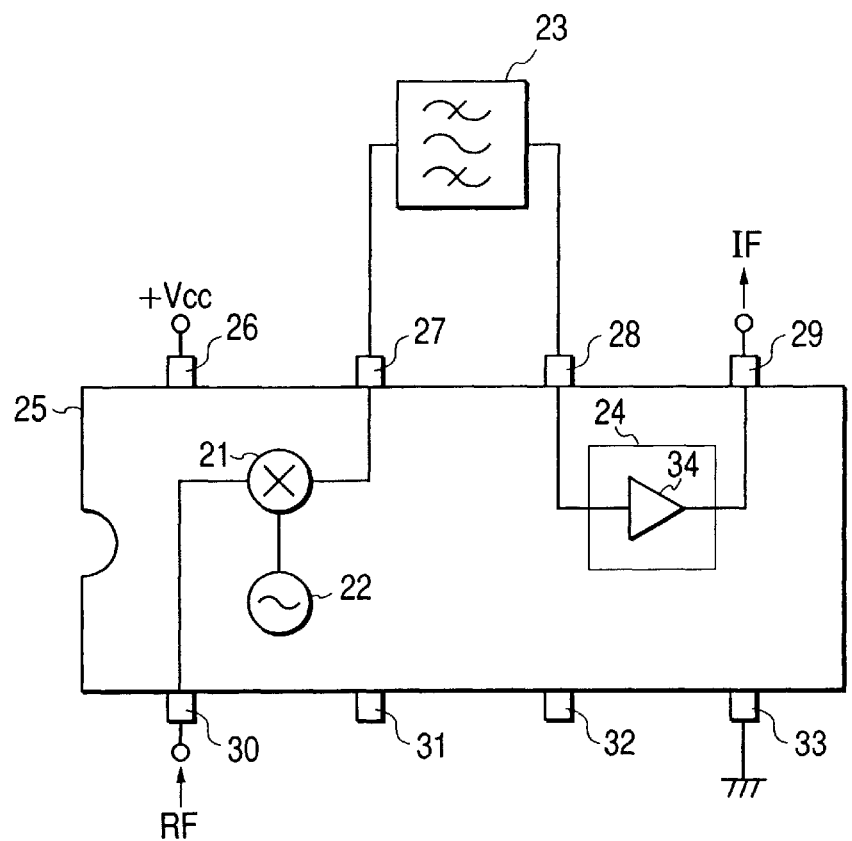
FIG. 3 is a block diagram showing the configuration of a conventional intermediate frequency circuit.
Figure 4:
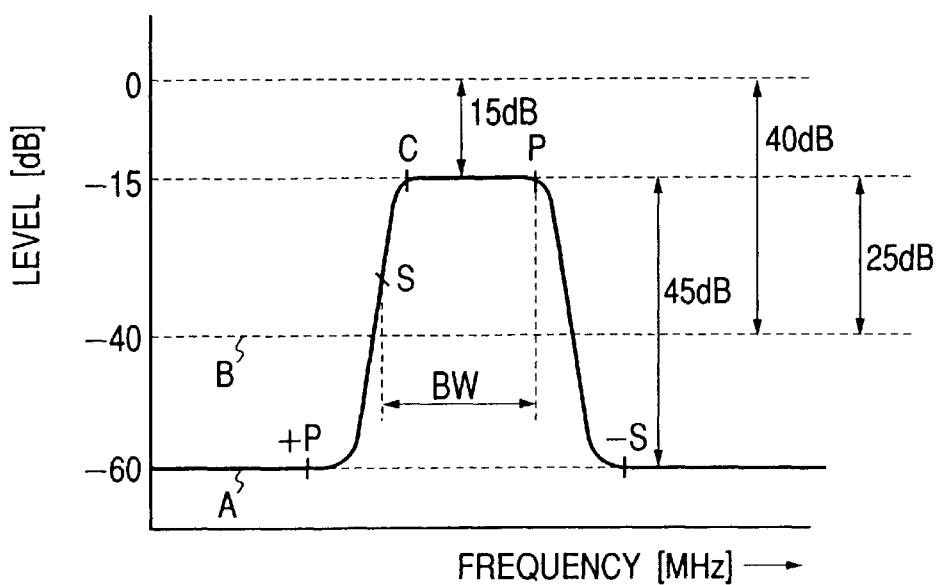
FIG. 4 is a selectivity characteristic diagram of the conventional intermediate frequency circuit.

An embodiment of the invention will be described hereinbelow with reference to FIGS. 1 and 2. FIG. 1 is a block diagram showing the configuration of a television signal receiving tuner of the invention. FIG. 2 shows the selectivity characteristics of an intermediate frequency band in the television signal receiving tuner of the invention.

In FIG. 1, a tuner for use in a television receiver comprises a mixer 1, a local oscillator 2, a first intermediate frequency amplifying circuit 3, an SAW filter 4, an intermediate frequency circuit 5, and the like. The tuner is formed in an integrated circuit for miniaturization and the mixer 1, local oscillator 2, intermediate frequency circuit 5, and the like are integrally formed in an integrated circuit 6.

The integrating circuit 6 has a plurality of terminals 7 to 14 so as to be connected to other circuits.

In FIG. 1, a television signal RF received by an antenna (not shown) is passed through a resonance circuit (not shown) and is supplied to the mixer 1 in the integrated circuit 6 via the input terminal 11. The television signal RF is frequency converted by the mixer 1 and the local oscillator 2 and is outputted as an intermediate frequency signal IF from the first terminal 8 to the outside of the integrated circuit. The intermediate frequency signal IF outputted from the first terminal 8 is amplified by almost 20 dB by the first intermediate frequency amplifying circuit 3 provided on the outside of the integrated circuit 6 and supplied to the SAW filter 4 similarly provided on the outside of the integrated circuit 6. The intermediate frequency signal IF is passed through the SAW filter 4 and is supplied again to the integrated circuit 6 via the second terminal 9. The intermediate frequency signal IF which is supplied again to the integrated circuit 6 is properly amplified by a second intermediate frequency amplifying circuit 15 in the intermediate frequency circuit 5 to a level necessary for a detecting operation of a video detecting circuit (not shown) at the post stage, and the resultant signal is outputted from the integrated circuit 6 via the output terminal 10 and is supplied to the video detecting circuit.

The selectivity characteristic of the SAW filter 4 has, as shown by A in FIG. 2, a sharp attenuation characteristic out of an intermediate frequency band BW in order to eliminate the interference from adjacent channels. An attenuation amount of each of a video intermediate frequency signal +P which is in an adjacent band on the upper side and a sound intermediate frequency signal –S which is in an adjacent band on the lower side from a video intermediate frequency signal P is 45 dB.

The insertion loss of the SAW filter 4 is 15 dB.

On the other hand, the isolation between the first terminal 8 and the second terminal 9 in the integrated circuit 6 is 40 dB.

In the configuration, when it is assumed that the level of the video intermediate frequency signal P at the first terminal 8 is a reference value 0 dB, since the amplification degree of the first intermediate frequency amplifying circuit 3 is 20 dB and the insertion loss of the SAW filter 4 is 15 dB, the level of the video intermediate frequency signal P which is passed through the first intermediate frequency amplifying circuit 3 and the SAW filter 4 in series and is supplied to the second input terminal 9 is +5 dB.

On the other hand, since the isolation between the first terminal 8 and the second terminal 9 is 40 dB (refer to a broken line B), the level of each of the video intermediate frequency signal +P which is in the adjacent band on the upper side and the sound intermediate frequency signal –S which is in the adjacent band on the lower side at the first terminal 8 is attenuated by 40 dB and the attenuated signals appear at the second terminal 9. As a result, the difference between the level of the video intermediate frequency signal P which has passed the SAW filter 4 and the level of each of the video intermediate frequency signal +P which is in the adjacent band on the upper side and the sound intermediate frequency signal –S which is in the adjacent band on the lower side becomes 45 dB. The selectivity characteristic of the SAW filter 4 can be therefore obtained as it is and the interference of the adjacent channels can be prevented.

In order to utilize the selectivity characteristic of the SAW filter 4 as it is, the difference between the level of the video intermediate frequency signal P passed through the SAW filter 4 and the level of each of the video intermediate frequency signal +P in the upper adjacent band, which is leaked from the first terminal 8 to the second terminal 9 and the sound intermediate frequency signal –S which is in the adjacent band on the lower side has to be larger than the attenuation amount of a signal of the adjacent channel of the SAW filter 4. The amplification degree of the first intermediate frequency amplifying circuit 3 has to be equal to or higher than a value obtained by adding the insertion loss of the SAW filter 4 to the absolute value of the difference between the isolation between the first terminal 8 and the second terminal 9 in the integrated circuit 6 and the attenuation amount of the signal in the adjacent channel of the SAW filter 4.

Consequently, in the case of the embodiment, the amplification degree of the first intermediate frequency amplifying circuit 3 has to be 20 dB or higher.

Even when the first intermediate frequency amplifying circuit 3 is mounted at the front stage or the post stage of the SAW filter 4, the difference between the level of the video intermediate frequency signal P which is passed through the SAW filter 4 and supplied to the second terminal 9 and the level of each of the video intermediate frequency signal +P which is leaked from the first terminal 8 to the second terminal 9 in the integrated circuit 6 and is in the adjacent band on the upper side and the sound intermediate frequency signal –S which is in the adjacent band on the lower side remains at the same value of 45 dB. When the first intermediate frequency amplifying circuit 3 is mounted at the front stage of the SAW filter 4, however, the noise figure of the intermediate frequency signal IF is lower.

As described above, the television signal receiving tuner of the invention comprises: the integrating circuit including the mixer and the intermediate frequency circuit which frequency convert at least a received television signal to an intermediate frequency signal; the intermediate frequency amplifying circuit which is separate from the integrated circuit and has an amplification degree; and the SAW filter which is separate from the integrated circuit and attenuates adjacent bands out of the intermediate frequency band of the television signal by a predetermined attenuation amount. The integrated circuit has at least a first terminal and a second terminal and outputs the intermediate frequency signal obtained by the frequency conversion by the mixer from the first terminal, and the intermediate frequency signal is serially passed through the intermediate frequency amplifying circuit and the SAW filter and supplied from the second terminal to the intermediate frequency circuit. Consequently, without hardly influenced by the intermediate frequency signal leaked from the first terminal to the second terminal, the attenuation amount of the signals of the adjacent channels can be increased, so that the video quality of the television receiver can be increased.

According to the television signal receiving tuner of the invention, since the amplification degree of the intermediate frequency amplifying circuit is set to be equal to or higher than a value obtained by adding the insertion loss of the SAW filter to the absolute value of a difference between the isolation between the first and second terminals and the attenuation amount of the SAW filter, the selectivity characteristic of the SAW filter can be utilized as it is.

In the television signal receiving tuner of the invention, since the intermediate frequency amplifying circuit is provided at the front stage of the SAW filter, the noise figure of the intermediate frequency signal IF is preferable and the video quality of the television receiver can be increased.

What is claimed is:

1. A television signal receiving tuner comprising:

an integrating circuit including at least a mixer which frequency converts a received television signal to an intermediate frequency signal and an intermediate frequency circuit;

an intermediate frequency amplifying circuit which is separate from the integrated circuit and has an amplification degree; and an SAW filter which is separate from the integrated circuit and attenuates adjacent bands out of the intermediate frequency band of the television signal by a predetermined attenuation amount, wherein the integrated circuit has at least a first terminal and a second terminal and outputs the intermediate frequency signal obtained by the frequency conversion by the mixer from the first terminal, and the intermediate frequency signal is serially passed through the intermediate frequency amplifying circuit and the SAW filter and supplied from the second terminal to the intermediate frequency circuit, wherein the amplification degree of the intermediate frequency amplifying circuit is set to be equal to or higher than a value which is obtained by adding insertion loss of the SAW filter to the absolute value of a difference between the isolation between the first terminal and the second terminal and the attenuation amount of the SAW filter.

2. A television signal receiving tuner according to claim 1, wherein the intermediate frequency amplifying circuit is provided at the front stage of the SAW filter.

* * * * *